United States Patent [19]
Koyama

[11] Patent Number: 5,554,864
[45] Date of Patent: Sep. 10, 1996

[54] SEMICONDUCTOR DEVICE HAVING IMPROVED COVERAGE WITH INCREASED WIRING LAYERS

[75] Inventor: Kuniaki Koyama, Tokyo, Japan

[73] Assignee: NEC Corporation, Tokyo, Japan

[21] Appl. No.: 314,968

[22] Filed: Sep. 29, 1994

[30] Foreign Application Priority Data

Oct. 18, 1993 [JP] Japan .................................. 5-258786

[51] Int. Cl.⁶ .................................................. H01L 23/48
[52] U.S. Cl. .......................... 257/211; 257/758; 257/774
[58] Field of Search .................................. 257/758, 211, 257/210, 774, 760

[56] References Cited

U.S. PATENT DOCUMENTS

| 5,103,288 | 4/1992 | Sakamoto et al. | 257/758 |
| 5,179,427 | 1/1993 | Nakayama et al. | 257/211 |

FOREIGN PATENT DOCUMENTS

| 58-87848 | 5/1983 | Japan . |
| 60-57648 | 4/1985 | Japan . |
| 62-43149 | 2/1987 | Japan . |
| 4-25075 | 1/1992 | Japan . |

OTHER PUBLICATIONS

A. Shinohara et al., "A New Self–Aligned Contact Technology for LDD MOS Transistors", Extended Abstracts of the 17th Conference on Solid State Devices and Materials, Tokyo, 1985, pp. 29–32.

Primary Examiner—William Mintel
Assistant Examiner—Roy Potter
Attorney, Agent, or Firm—Sughrue, Mion, Zinn, Macpeak & Seas

[57] ABSTRACT

In a semiconductor device having a multilayer wiring, first and second lower wiring sections are formed on a base insulating film. An interlayer insulating layer covers the first and the second lower wiring sections. In the interlayer insulating layer, first and second contact holes are bored so as to reach the first and the second lower wiring sections, respectively. In the first and the second contact holes, first and second conductors are embedded so as to connect with the first and the second lower wiring sections, respectively. Formed on an upper surface of the interlayer insulating layer, a first upper wiring section interconnects with the first lower wiring section via the first conductor. The first upper wiring section has an upper surface and a side surface on which an upper insulating film and a side-wall insulating film are formed. Formed on an upper surface of the second conductor, a second upper wiring section covers an upper surface of the interlayer insulating layer so as to interconnect with the second lower wiring section via the second conductor. The second upper wiring section overlies the first upper wiring section with the second upper wiring section isolated from the first upper wiring section by the upper insulating film and the side-wall insulating film.

24 Claims, 11 Drawing Sheets

SEMICONDUCTOR DEVICE HAVING IMPROVED COVERAGE WITH INCREASED WIRING LAYERS

BACKGROUND OF THE INVENTION

This invention relates to a semiconductor device and a method of manufacturing the semiconductor device and, in particular, to a semiconductor device having a multilayer wiring and a manufacturing method thereof.

In recent wiring technique, multilayer of wiring has been carried out in the technical field of semiconductor devices with high density and with large-scale integration thereof. The large subjects for the multilayer of wiring are the improvement of coverage in wiring for contact sections and the improvement of forming methods of insulating films for wiring layers.

Measures for the coverage in wiring for the contact sections are disclosed, for example, in Japanese Unexamined Patent Prepublication No. 87848/83 and in Japanese Unexamined Patent Prepublication No. 57648/85. The measures are methods of embedding conductors in contact holes and will later be described in conjunction with FIGS. 1(A) through 1(E). However, various problems occur in these methods when the number of the wiring layers increases. That is, as will later be described in conjunction with FIG. 2, when the number of the wiring layers increases, an interlayer insulating region becomes thick. As a result, it is difficult to embed the conductors in the contact holes if the conductors are not made of material which satisfies a severe condition. In addition, the embedded conductors have a high electric resistance which results in hurdles on the road to high speed. Furthermore, these methods are disadvantageous in that they comprise a lot of steps. This is because both contact hole boring processes and embedding processes are required for each wiring layer.

On the other hand, measures for forming methods of the insulating films for the wiring layers are disclosed, for example, by A. Shinohara et al in a paper submitted to "Extended Abstract of the 17th Conference on Solid State Devices and Materials", Tokyo, 1985, pages 29–32 under the title of "A New Self-Aligned Contact Technology for LDD MOS Transistors" and in Japanese Unexamined Patent Prepublication No. 43149/87. The measures are methods of forming side-wall insulating films on a side surface of a wiring layer and will later be described in conjunction with FIGS. 3(A) through 3(F). However, in these method, when a contact hole for an upper wiring layer is required in a position without a lower wiring layer, the contact hole must be necessarily bored by using a photo resist or the like as a mask. As a result, it is impossible to reduce the number of the contact hole making processes. In addition, these methods are defective in that it has no effect to improve coverage of wiring in the contact hole when the interlayer insulating region becomes thick.

SUMMARY OF THE INVENTION

It is therefore an object of this invention to provide a semiconductor device which is capable of improving coverage for a wiring layer by forming a shallow contact hole.

It is another object of this invention to provide a semiconductor device of the type described, which is capable of reducing a contact resistivity in the contact hole.

It is still another object of this invention to provide a semiconductor device of the type described, which is capable of forming an insulating film between wiring layers in a self-alignment fashion.

It is yet another object of this invention to provide a semiconductor device of the type described, which is capable of preventing an increase of the number of contact hole making processes with a multilayer wiring.

Other objects of this invention will become clear as the description proceeds.

According to an aspect of this invention, a semiconductor device comprises a base film having a principal surface. An interlayer insulating region is formed on the principal surface of the base film. First and second conductive sections are formed in the interlayer insulating region. The interlayer insulating region has first and second contact holes which reach the first and the second conductive regions, respectively. The interlayer insulating region has an upper surface. A first conductor is embedded in the first contact hole. The first conductor connects with the first conductive section. Connected with the first conductor, a first conductive region covers the upper surface of the interlayer insulating region. The first conductive region has an upper surface and a side surface. An upper insulating film covers the upper surface of the first conductive region. A side-wall insulating film covers the side surface of the first conductive region. A second conductor is embedded in the second contact hole. The second conductor connects with the second conductive section. A second conductive region covers the second conductor, the upper surface of the interlayer insulating region, the upper insulating film, and the side-wall insulating film. The second conductive region overlies the first conductive region with the second conductive region isolated from the first conductive region by the upper insulating film and the side-wall insulating film.

According to another aspect of this invention, a method of manufacturing the semiconductor device of the type described is provided. It comprises the steps of: preparing a base film having a principal surface; forming first and second conductive sections on/over the principal surface of the base film; depositing an interlayer insulating region having an upper surface on the principal surface of the base film, the interlayer insulating region covering the first and the second conductive sections; simultaneously forming first and second contact holes in the interlayer insulating region, the first and the second contact holes reaching the first and the second conductive sections, respectively; depositing a first conductive material in the first and the second contact holes and on the upper surface of the interlayer insulating region; covering the first conductive material with an upper insulating material; patterning the upper insulating material and the first conductive material to embed first and second conductors in the first and the second contact holes, to form a first conductive region having a side surface on the upper surface of the interlayer insulating region with the first conductive region connected with the first conductor, to cover the first conductive region with an upper insulating film having an upper surface, and to expose the upper surface of the interlayer insulating region and an upper surface of the second conductor; depositing a side-wall insulating material on the upper surface of the interlayer insulating region, on the upper surface of the second conductor, on the upper surface of the upper insulating film, and on the side surface of the first conductive region; etching the side-wall insulating material by means of anisotropic dry etching process to form a side-wall insulating film on the side surface of the first conductive region and to expose the upper surface of the interlayer insulating region and the upper surface of the second conductor; forming a second conductive material on the upper surface of the interlayer insulating region, on the upper surface of the second conductor, on the upper surfaces of the upper insulating film, and on the side-wall insulating film; and etching the second conductive material to form a second conductive region on the upper surface of the interlayer insulating region so as to connect the second conductive region with the upper surface of the second conductor, the second conductive region covering the upper insulating film and the side-wall insulating film, whereby the second conductive region overlies the first conductive region with the second conductive region isolated from the first conductive region by the upper insulating film and the side-wall insulating film.

DETAILED DESCRIPTION OF THE PREFERRED EMBODIMENTS

Referring to FIGS. 1(A) through 1(E), a manufacturing method of a conventional semiconductor device having a multilayer wiring will first be described in order to facilitate an understanding of the present invention. This method is a method of embedding a conductor in a contact hole and is disclosed, for example, in Japanese Unexamined Patent Prepublication No. 87848/83 and in Japanese Unexamined Patent Prepublication No. 57648/85.

Figure 1A:
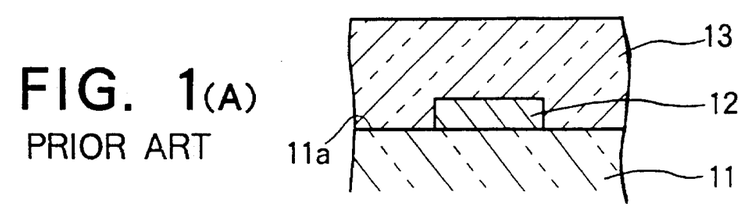
FIGS. 1(A)–1(E) illustrate the manufacturing process sequence of a conventional semiconductor device.

As shown in FIG. 1(A), a base insulating film 11 is prepared in a known manner and has the principal surface 11a which is directed an upward of FIG. 1(A). A lower wiring section 12 is formed on the principal surface 11a of the base insulating film 11. The lower wiring section 12 is called a conductive section and composes an n-th wiring layer formed on the base insulating film 11 where n represents a natural number. The principal surface 11a of the base insulating film 11 and the lower wiring section 12 are covered with an interlayer insulating layer 13 having an upper surface.

Figure 1B:
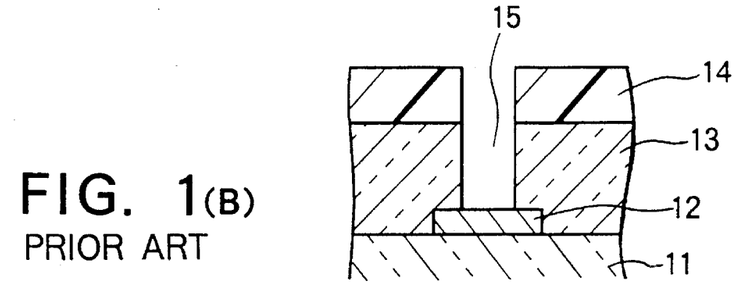

Turning to FIG. 1(B), by using a photoresist pattern 14 as a mask, the contact hole depicted at 15 is bored in the interlayer insulating layer 13 so as to reach the lower wiring section 12. This process is called a contact hole boring process.

Figure 1C:
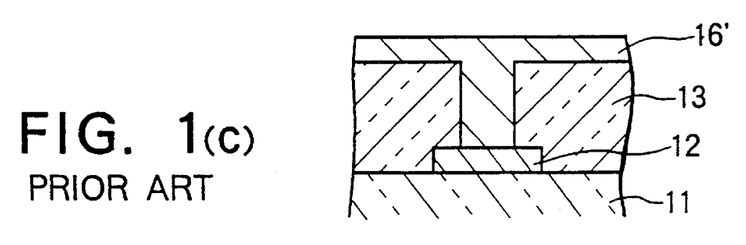

Turning to FIG. 1(C), after removal of the photoresist pattern 14, a polysilicon layer 16' is deposited in the contact hole 15 and on the upper surface of the interlayer insulating layer 13. The polysilicon layer 16' consists of a conductive material with good coverage for the contact hole 15.

Figure 1D:
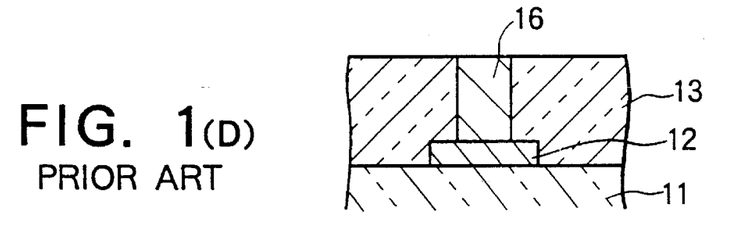

Turning to FIG. 1(D), in the contact hole 15, the conductor depicted at 16 is embedded by etch back which consists of the polysilicon layer 16'. This process is called an embedding process.

Figure 1E:
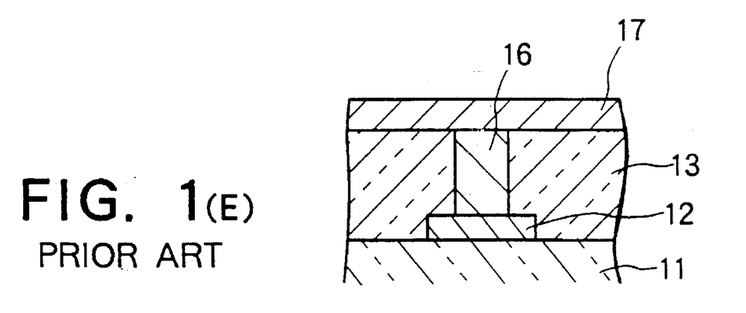

Turning to FIG. 1(E), a tungsten silicide (WSi) is deposited on the upper surface of the interlayer insulating layer 13 so as to connect with an upper surface of the conductor 16 and thereafter patterning is carried out to form an upper wiring section 17. The upper wiring section 17 is called a conductive region and composes an (n+1)-th wiring layer.

This method can improve coverage by the contact hole 15 by embedding the conductor 16 in the contact hole 15. However, various problems occur in this method when the number of the wiring layers increases, as will later be described.

Figure 2:
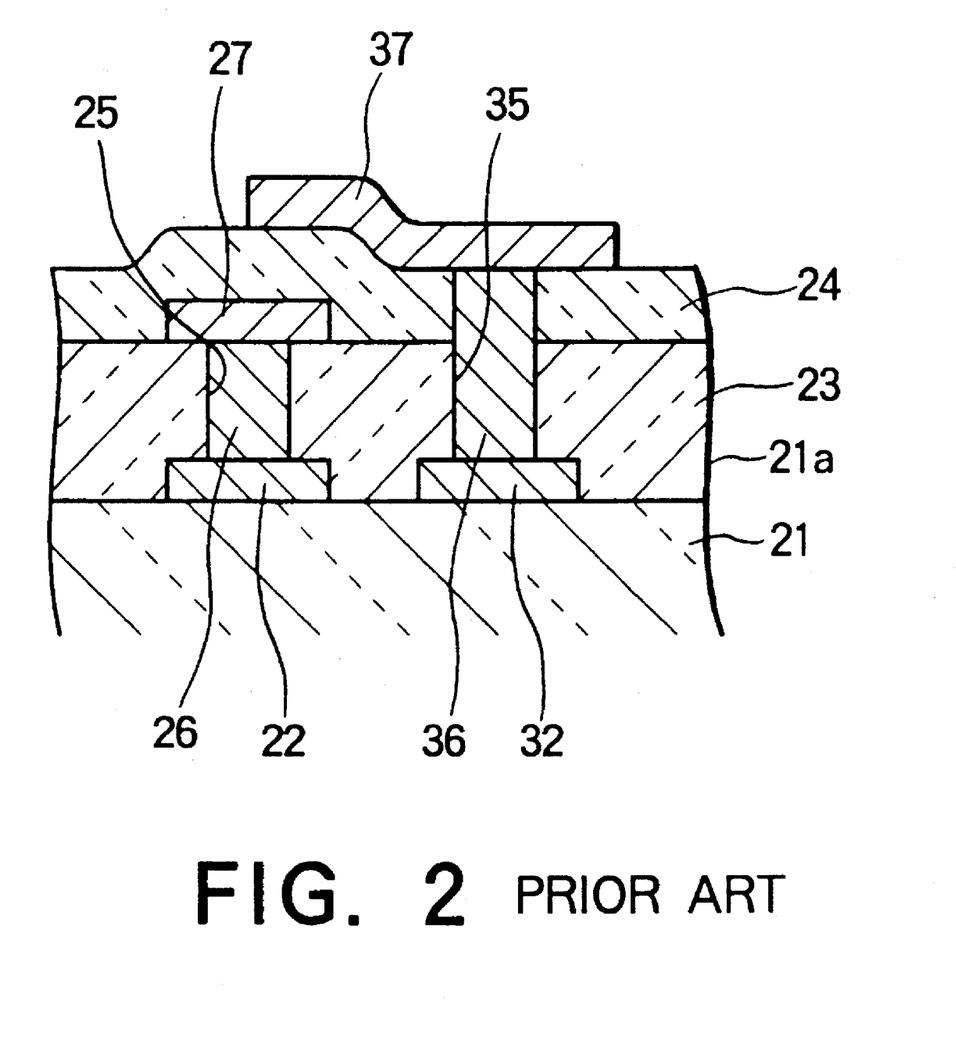
FIG. 2 is a cross-sectional view of another conventional semiconductor device.

Turning to FIG. 2, description will proceed to another conventional semiconductor device in a case where the number of the wiring layers is increased from two as shown in FIG. 1(E) by one to three.

In the conventional semiconductor device illustrated in FIG. 2, a base insulating film 21 is prepared in a known manner and has the principal surface 21a which is directed an upward of FIG. 2. First and second lower wiring sections 22 and 32, both of which compose the n-th wiring layer, are formed on the principal surface 21a of the base insulating film 21. The first and the second lower wiring sections 22 and 32 are called first and second conductive sections, respectively. The principal surface 21a of the base insulating film 21 and the first and the second lower wiring sections 22 and 32 are covered with a first interlayer insulating layer 23. Subsequently, a first contact hole 25 is bored in the first interlayer insulating layer 23 so as to reach the first lower wiring section 22. The first contact hole 25 is embedded with a first conductor 26. A first upper wiring section 27, which composes the (n+1)-th wiring layer, is formed on an upper surface of the first interlayer insulating layer 23 so as to connect it with the first conductor 22. The first upper wiring section 27 is called a first conductive region. Thereafter, a second interlayer insulating layer 24 is formed on the upper surface of the first interlayer insulating layer 23 and covers the first upper wiring section 27. A second contact hole 35 is bored in both the second and the first interlayer insulating layers 24 and 23 to reach the second lower wiring section 32. The second contact hole 35 is embedded with a second conductor 36. A second upper wiring section 37 which composes an (n+2)-th wiring layer, is formed on the upper surface of the second interlayer insulating layer 24 to connect it with the second conductor 36. The first and the second interlayer insulating layers 23 and 24 are collectively called an interlayer insulating region.

As described above, in the conventional semiconductor devices, when the number of the wiring layers increases, the interlayer insulating region becomes thick. As a result, it is difficult to embed the conductors in the contact holes if the conductors are not made of material which satisfies a severe condition. In addition, the embedded conductors have a high electric resistance and it results in hurdles on the road to high speed. Furthermore, the conventional semiconductor devices are disadvantageous in that they are manufactured by a lot of processes because both the contact hole boring processes and the embedding process are required to each wiring layer.

Referring to FIGS. 3(A) through 3(F), another manufacturing method of still another conventional semiconductor device will be described in order to facilitate an understanding of the present invention. The illustrated semiconductor device is a metal oxide semiconductor (MOS) transistor. This method is a method of forming a side-wall insulating film on a side surface of a wiring layer and is disclosed, for example, in the above-mentioned paper by A. Shinohara et al and in Japanese Unexamined Patent Prepublication No. 43149/87.

Figure 3A:
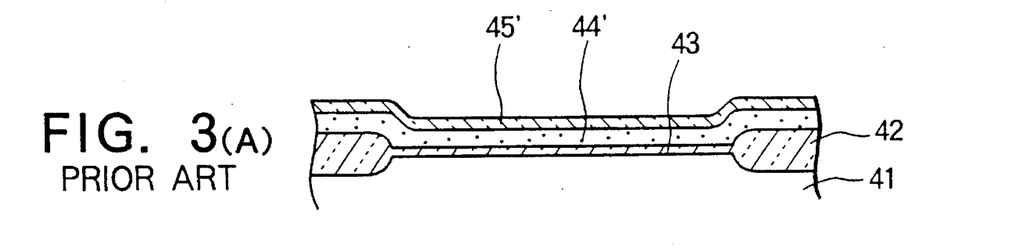
FIGS. 3(A)–3(F) illustrate the manufacturing process sequence of still another conventional semiconductor device.

As shown in FIG. 3(A), a P-type silicon substrate 41 is prepared in a known manner and has the principal surface which is directed an upward of FIG. 3(A). A thick field oxide layer 42 and a thin field oxide layer 43 are formed on the principal surface of the P-type silicon substrate 41 by means of the selective oxidation process which is well known in the art. The thick field oxide layer 42 defines an element forming region. The thin field oxide layer 43 serves as a gate oxide layer. A polysilicon film 44' is deposited on both the thick field oxide layer 42 and the thin field oxide layer 43. The polysilicon film 44' consists of a material for a gate electrode. A silicon nitride film 45' is formed on the polysilicon film 44'.

Figure 3B:
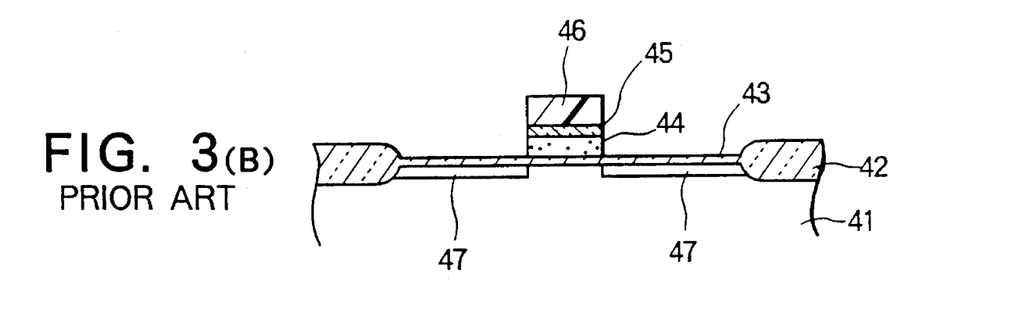

Turning to FIG. 3(B), by using a photoresist pattern 46 as a mask, the silicon nitride film 45' and the polysilicon film 44' are patterned to configure the gate electrode denoted at 44 and a silicon nitride film pattern 45. The gate electrode 44 acts as a lower wiring section of the n-th wiring layer. Thereafter, by using the photoresist pattern 46 as the mask, ion implantation of an N-type impurity is made in the P-type silicon substrate 41 to form source and drain regions 47 and 47 beneath the thin field oxide layer 43.

Figure 3C:
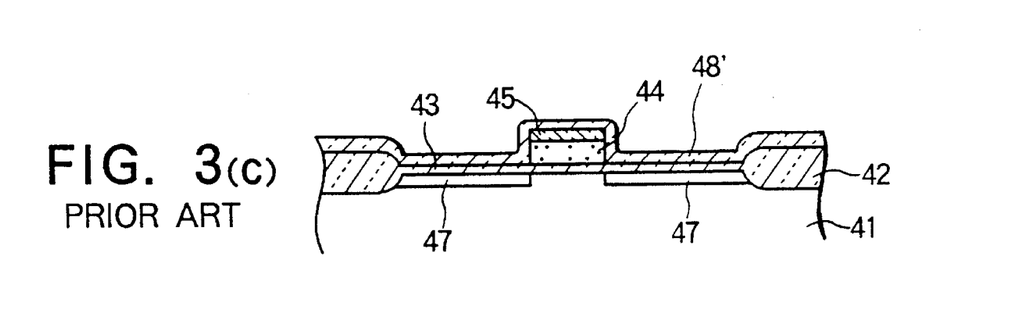

Turning to FIG. 3(C), after removal of the photoresist pattern 46, a silicon nitride film 48' is deposited on the whole surface of the substrate 41. That is, the silicon nitride film 48' covers on an upper surface and a side surface of the silicon nitride film pattern 45, on a side surface of the gate electrode 44, on the upper surface of both the thick field oxide layer 42 and the thin field oxide layer 43.

Figure 3D:
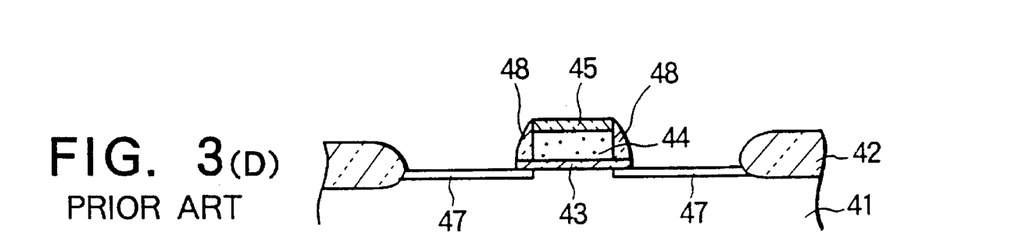

Turning to FIG. 3(D), by anisotropic etching, a side-wall insulating film 48 consisting of the silicon nitride film 48' is formed on the side surface of both the silicon nitride film pattern 45 and the gate electrode 44. By using the silicon nitride film pattern 45 and the side-wall insulating film 48 as a mask, the thin field oxide layer 43 on the source and the drain regions 47 and 47 is removed from the source and the drain regions 47 and 47.

Figure 3E:
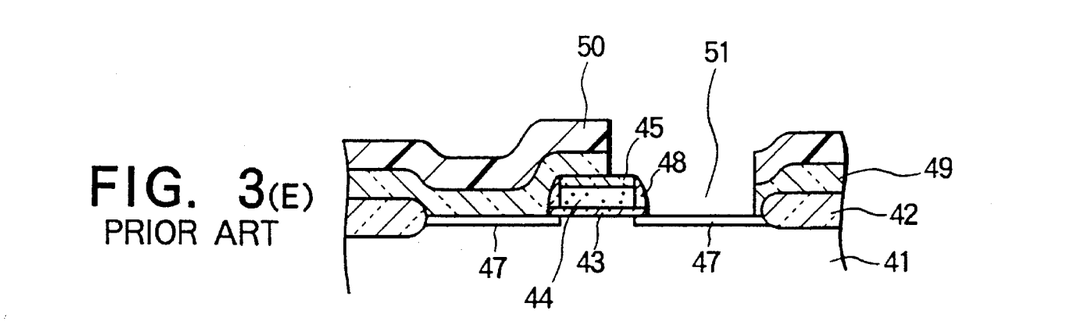

Turning to FIG. 3(E), a silicon oxide film 49 is deposited on the whole surface of the substrate 41. The silicon oxide film 49 acts as an interlayer insulating layer. By using a photo resist 50 as a mask, the silicon oxide film 49 is selectively etched to make a contact hole 51.

Figure 3F:
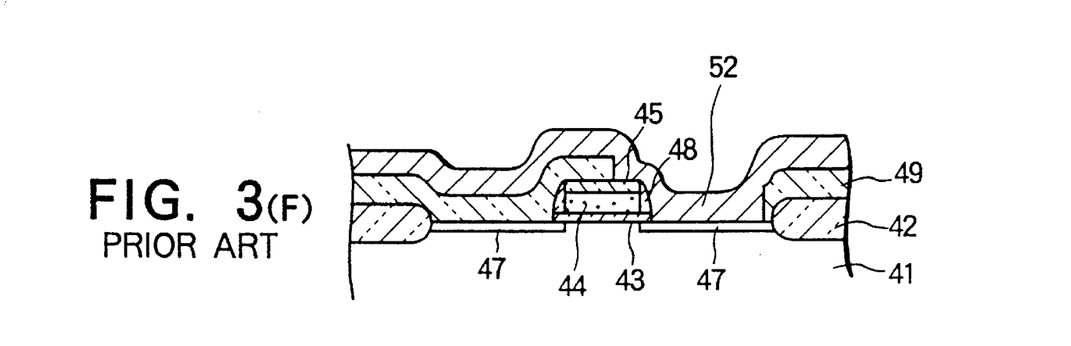

Turning to FIG. 3(F), after removal of the photo resist 50, a wiring film 52 is formed on the whole surface of the substrate 41. The wiring film 52 serves as an upper wiring section of the (N+1)-th wiring layer.

This method is a method of isolating the lower wiring section of the n-th wiring layer (the gate electrode 44) from the upper wiring section of the (n+1)-th wiring layer (the wiring film 52) by forming the silicon nitride film pattern 45 and the side-wall insulating film 48 on the upper surface and the side surface of the gate electrode 44 in a self-alignment fashion.

However, in the manufacturing method of the conventional semiconductor device illustrated in FIGS. 3(A) through 3(F), when a contact hole for an upper wiring section of the (n+1)-th wiring layer is required in a position without a lower wiring section of the n-th wiring layer, the contact hole must be necessarily made by using a photo resist or the like as a mask. As a result, it is impossible to reduce the number of the contact hole boring processes. In addition, this manufacturing method is defective in that it has no effect to improve coverage of wiring in the contact hole when the interlayer insulating layer becomes thick.

Figure 4:
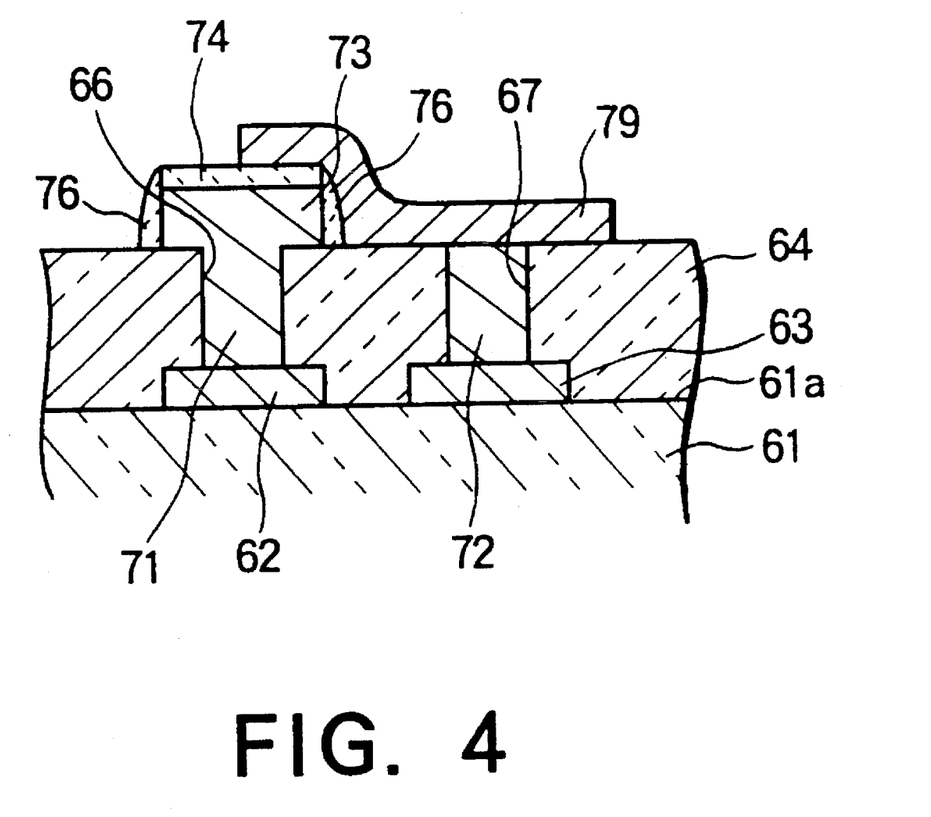
FIG. 4 is a cross-sectional view of a semiconductor device according to a first embodiment of the present invention.

Referring to FIG. 4, description will be made as regards a semiconductor device having a multilayer wiring according to a first embodiment of the present invention.

A base insulating film 61 has the principal surface 61a on which first and second lower wiring sections 62 and 63 are formed. The principal surface 61a of the base insulating film 61 and the first and the second lower wiring sections 62 and 63 are covered with an interlayer insulating layer 64 which acts as an interlayer insulating region. In the interlayer insulating layer 64, first and second contact holes 66 and 67 are bored so as to reach the first and the second lower wiring sections 62 and 63, respectively. In the first and the second contact holes 66 and 67, first and second conductors 71 and 72 are embedded so as to connect with the first and the second lower wiring sections 62 and 63, respectively. Each of the first and the second conductors 71 and 72 consists essentially of polysilicon. A first upper wiring section 73 is formed on an upper surface of the interlayer insulating layer 64. The first upper wiring section 73 interconnects with the first lower wiring section 62 via the first conductor 71. The first upper wiring section 73 is continuously formed to the first conductor 71 and consists essentially of the polysilicon. The first upper wiring section 73 has an upper surface and a side surface on which an upper insulating film 74 and a side-wall insulating film 76 are formed with the upper insulating film 74 and the side-wall insulating film 76 self-aligned to the first upper wiring section 73. On an upper surface of the second conductor 72 composed of polysilicon, a second upper wiring section 79 composed of aluminum or aluminum alloy is formed to cover an upper surface of the interlayer insulating layer 64 so as to interconnect with the second lower wiring section 72 via the second conductor 72 and to cover the upper insulating film 74 and the side-wall insulating film 76 with the second upper wiring section 79 isolated from the first upper wiring section 73 and with the second upper wiring section 79 overlaid over the first upper wiring section 73.

Referring to FIGS. 5(A) through 5(G), description will be made as regards a method of manufacturing the semiconductor device illustrated in FIG. 4.

Figure 5A:
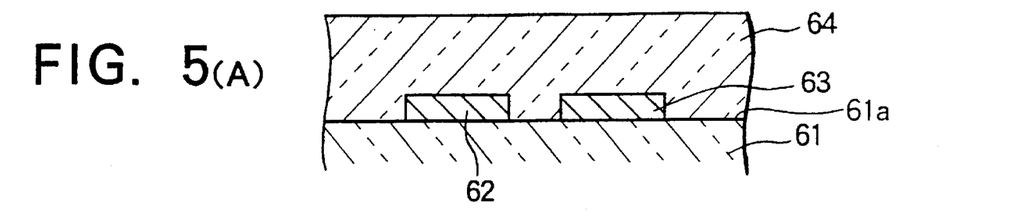
FIGS. 5(A)–5(G) illustrate the manufacturing process seqnence of the semiconductor device illustrated in FIG. 4.

As shown in FIG. 5(A), the base insulating film 61 is prepared in a known manner and has the principal surface 61a which is directed an upward of FIG. 5(A). The base insulating film 61 may consist of a silicon oxide film. The first and the second lower wiring sections 62 and 63 are formed on the principal surface 61a of the base insulating film 61. The first and the second lower wiring sections 62 and 63 compose the n-th wiring layer and are called first and second conductive sections, respectively. The principal surface 61a of the base insulating film 61 and the first and the second lower wiring sections 62 and 63 are covered or deposited with the interlayer insulating layer 64 which may consist of a silicon oxide layer. In the example being illustrated, the interlayer insulating layer 64 serves as an interlayer insulating region.

Figure 5B:
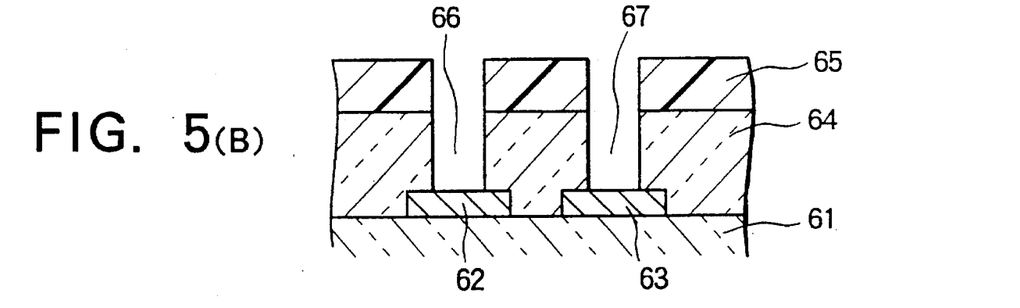

Turning to FIG. 5(B), by using a photoresist pattern 65 as a mask, the interlayer insulating layer 64 is etched to simultaneously bore the first and the second contact holes 66 and 67 therein. The first and the second contact holes 66 and 67 reach the first and the second lower wiring sections 62 and 63, respectively.

Figure 5C:
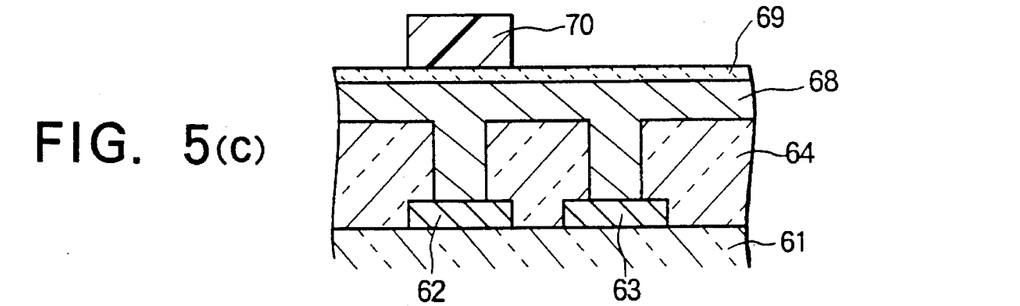

Turning to FIG. 5(C), after removal of the photoresist pattern 65, a polysilicon layer 68 doped with impurity is deposited into the first and the second contact holes 66 and 67 and on an upper surface of the interlayer insulating layer 64. An insulating film 69 covers on the polysilicon layer 68. The insulating film may be a silicon oxide film formed by a known CVD (chemical vapor deposition) process. A photoresist pattern 70 is formed on the insulating film 69. The photoresist pattern 70 is formed over a portion where the first contact hole 66 is formed.

Figure 5D:
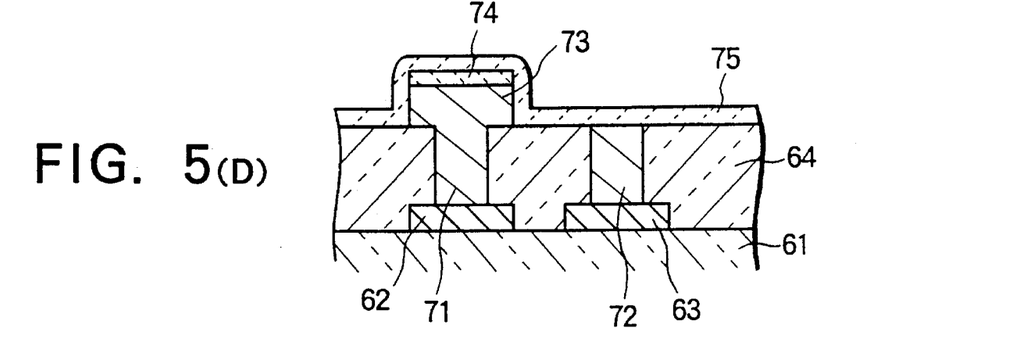

Turning to FIG. 5(D), by using the photoresist pattern 70 as a mask, the insulating film (the silicon oxide film) 69 and the polysilicon layer 68 are successively etched to form the first and the second conductors 71 and 72 and the first upper wiring section 73 continuously connected with the first conductor 71 and to configure the upper insulating film 74 having a plane configuration similar to that of the first upper wiring section 73. In the example being illustrated, the first upper wiring section 73 consists of a polysilicon film. The first upper wiring section 73 composes the (n+1)-th wiring layer and is called a first conductive region. The first and the second conductors 71 and 72 and the first upper wiring section 73 consist of the polysilicon layer 68 doped with impurity. The upper insulating film 74 consists of the insulating film (the silicon oxide film) 69. In this event, although the second conductor 72 in the second contact hole 67 has an upper surface which caves in that of the interlayer insulating layer 64 by overetching, coverage of a second upper wiring section to the second contact hole 67 is extremely improved as compared with the case where any is not embedded therein. After removal of the photoresist pattern 70, an insulating film 75 is formed on the upper surface of the interlayer insulating layer 64, on the upper surface of the second conductor 72, on an upper surface of the upper insulating film 74, and on a side surface of the first upper wiring section 73 by the CVD process. The insulating film 75 may consist of a silicon oxide film.

Figures 5E, 5F:
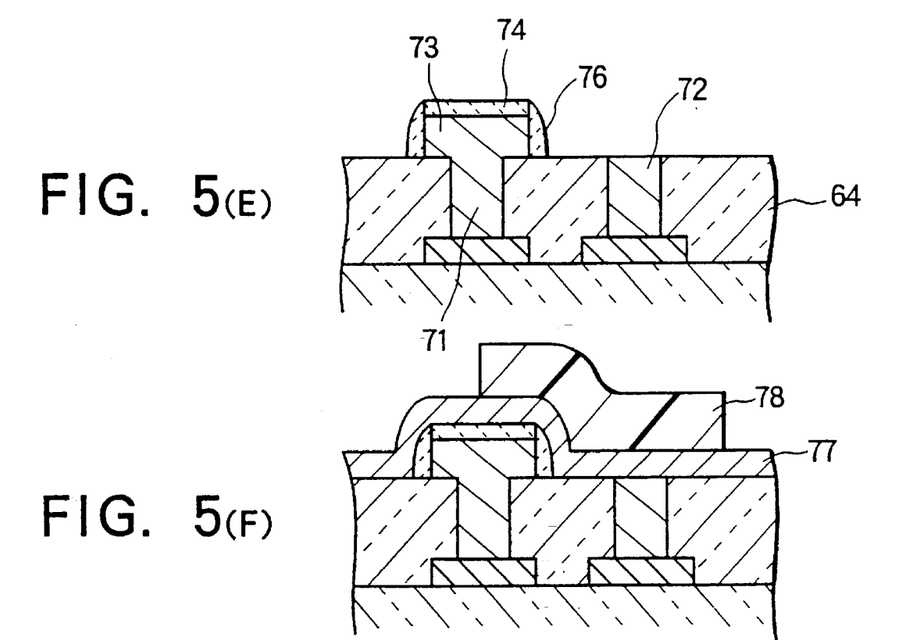

Turning to FIG. 5(E), the insulating film (the silicon oxide film) 75 is etched through the use of the well-known anisotropic dry etching process to form the side-wall insulating film 76 on the side surface of the first upper wiring section 73 and to expose the upper surface of the second conductor 72 embedded in the second contact hole 67 and the upper surface of the interlayer insulating layer 64.

Turning to FIG. 5(F), a metal film 77 is formed on the upper surface of the interlayer insulating layer 64, on the upper surface of the second conductor 72, on the upper surface of the upper insulating film 74, and on the side-wall insulating film 76 by a well-known sputtering process. The metal film 77 may consist of an aluminum (Al) film. A photoresist pattern 78 is formed on the metal film 77.

Figure 5G:
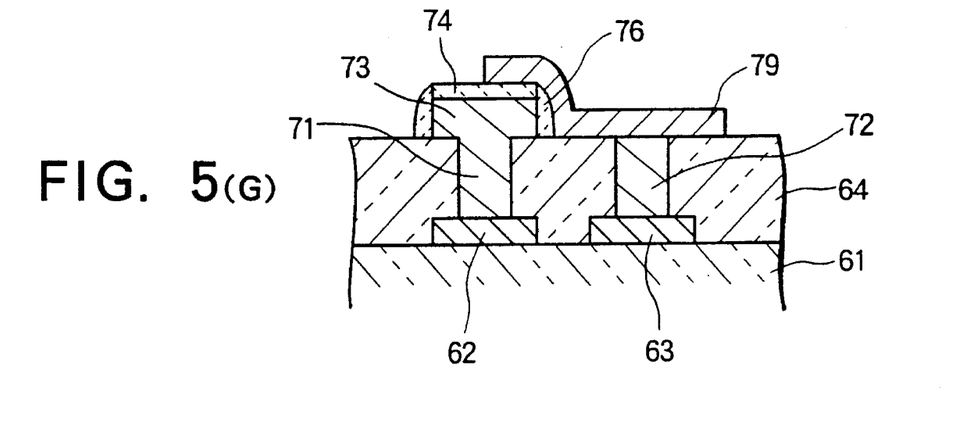

Turning to FIG. 5(G), by using the photoresist pattern 78 as a mask, the metal film 77 is etched to form the second upper wiring section 79. The second upper wiring section 79 composes the (n+2)-th wiring layer and is called a second conductive region. Thereafter, the photoresist pattern 78 is removed from the second upper wiring section 79, thereby resulting in the semiconductor device illustrated in FIG. 4.

Figure 6:
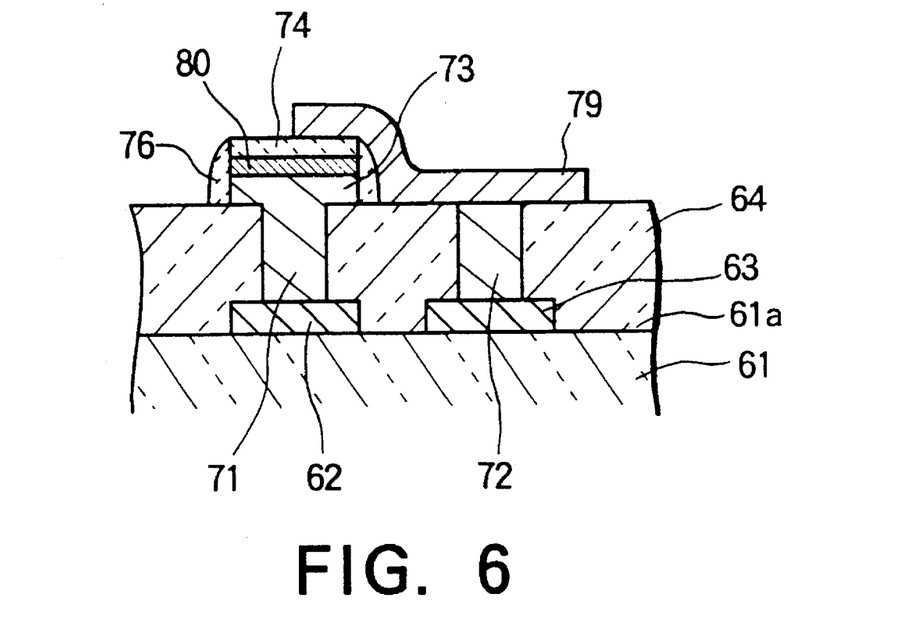
FIG. 6 a cross-sectional view of a semiconductor device according to a second embodiment of the present invention.

Turning to FIG. 6, description will proceed to a semiconductor device having a multilayer wiring according to a second embodiment of the present invention. The illustrated semiconductor device is similar in structure to that illustrated in FIG. 4 except that the first upper wiring section (the first conductive region) is modified from that illustrated in FIG. 4 as will later become clear. In FIG. 6, similar parts are designated by like reference numerals. Repeated description is omitted for the purpose of simplification of the description.

The first upper wiring section comprises the polysilicon film 73 which consists essentially of polysilicon and a high melting-point metal silicide film 80 formed on an upper surface of the polysilicon film 73. The high melting-point metal silicide film 80 may consist of a tungsten silicide (WSi) film. The high melting-point metal silicide film 80 is overlaid on the upper surface of the wiring layer 73 of polysilicon doped with impurity for the purpose of low resistance of the first upper wiring section.

Figure 7:
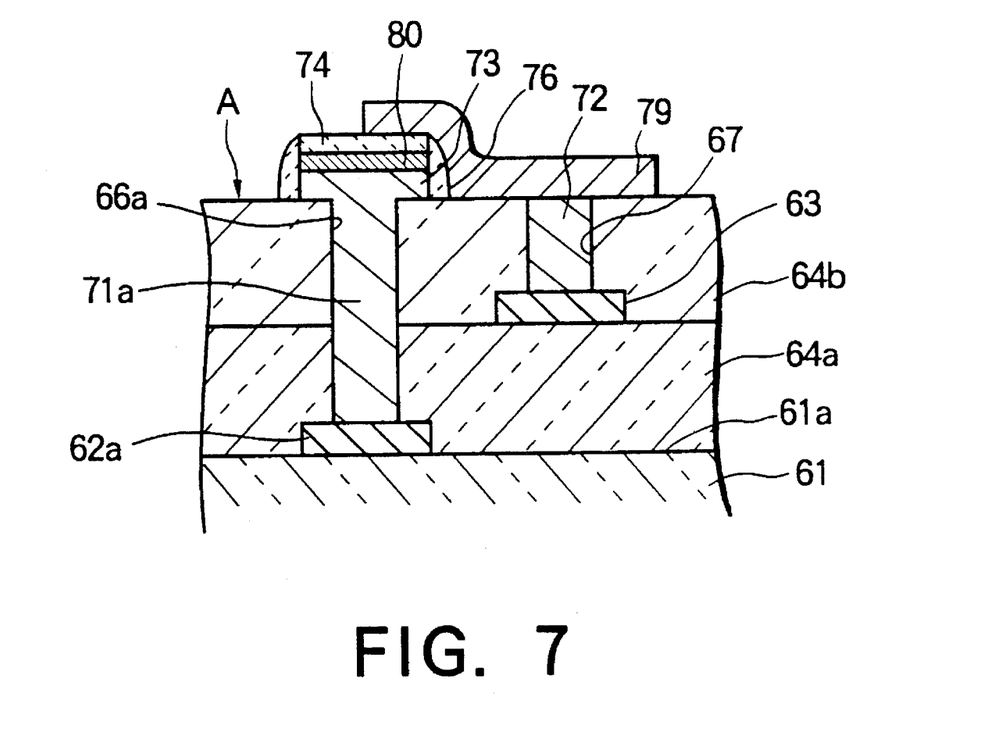
FIG. 7 is a cross-sectional view of a semiconductor device according to a third embodiment of the present invention.

Turning to FIG. 7, description will proceed to a semiconductor device having a multilayer wiring according to a third embodiment of the present invention. The illustrated semiconductor device is similar in structure to that illustrated in FIG. 6 except that the interlayer insulating region comprises first and second interlayer insulating films 64a and 64b. The first interlayer insulating film 64a is formed on the base insulating film 61. The second interlayer insulating film 64b is formed on the first interlayer insulating film 64a. In this connection, the first lower wiring section, the first contact hole, and the first conductor are depicted at 62a, 66a, and 71a, respectively.

The first lower wiring section 62a is formed on the principal surface 61a of the base insulating film 61. The second lower wiring section 63 is formed on the first Interlayer insulating film 64a. The first contact hole 66a is bored in both the first interlayer insulating film 64a and the second interlayer insulating film 64b. The second contact hole 67 is bored in the second interlayer insulating film 64b alone. The first conductor 71a is embedded in the first contact hole 66a. The first conductor 71a may consist of polysilicon doped with impurity like as the first conductor 71 illustrated in FIG. 4. In addition, in the similar manner illustrated in FIG. 5(B), the first and the second contact holes 66a and 67 are simultaneously bored in the interlayer insulating region by using the first and the second lower wiring sections 62a and 63 as etching stoppers. Furthermore, in the similar manner illustrated in FIGS. 5(C) and 5(D), the polysilicon is simultaneously deposited and configures the first conductor 71a, the polysilicon film 73, and the second conductor 72. In the example being illustrated, inasmuch as the first interlayer insulating film 64a lies between the first and the second lower wiring sections 62a and 63, the first contact hole 66a has a deep depth. However, the depth of the first contact hole 66a is a depth so as to sufficiently embed the polysilicon (the first conductor 71a) in the first contact hole 66a. In addition, inasmuch as the second interlayer insulating film 64b has an upper surface A on which a wiring structure is formed in the manner similar to that of the upper surface of the interlayer insulating layer 64 illustrated in FIG. 4, the wiring structure in FIG. 7 has an advantage which is similar to that of the wiring structure in FIG. 4.

Figure 8:
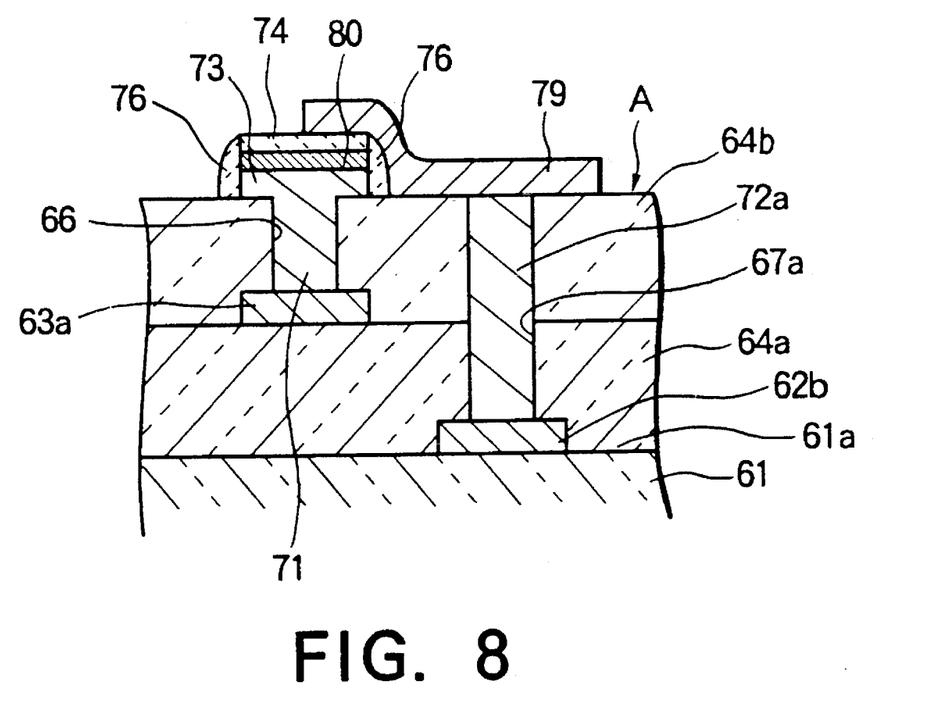
FIG. 8 is a cross-sectional view of a semiconductor device according to a fourth embodiment of the present invention.

Turning to FIG. 8, description will proceed to a semiconductor device having a multilayer wiring according to a fourth embodiment of the present invention. The illustrated semiconductor device is similar in structure to that illustrated in FIG. 6 except that the interlayer insulating region comprises the first and the second interlayer insulating films 64a and 64b like in FIG. 7. In this connection, the first and the second lower wiring sections, the second contact hole, and the second conductor are depicted at 62b, 63a, 67a, and 72a, respectively.

The first lower wiring section 62b is formed on the principal surface 61a of the base insulating film 61. The second lower wiring section 63a is formed on the first interlayer insulating film 64a.

The second contact hole 67a is bored in both the first interlayer insulating film 64a and the second interlayer insulating film 64b. The first contact hole 66 is bored in the second interlayer insulating film 64b alone. The second and the first contact holes 67a and 66 reach the first and the second lower wiring sections 62b and 63a, respectively. In the example being illustrated, the second and the first lower wiring sections 63a and 62b are called the first and the second conductive sections, respectively. The second conductor 72a is embedded in the second contact hole 67a. The second conductor 72a may consist of polysilicon doped with impurity like as the second conductor 72 illustrated in FIG. 4. In addition, in the similar manner illustrated in FIG. 5(B), the first and the second contact holes 66 and 67a are simultaneously bored in the interlayer insulating region by using the second and the first lower wiring sections 63a and 62b as etching stoppers. Furthermore, in the similar manner illustrated in FIGS. 5(C) and 5(D), the polysilicon is simultaneously deposited to configure the first conductor 71, the polysilicon film 73, and the second conductor 72a. In the example being illustrated, inasmuch as the first interlayer insulating film 64a lies between the first and the second lower wiring sections 62b and 63a, the second contact hole 67a has a deep depth. However, the depth of the second contact hole 67a is a depth so as to sufficiently embed the polysilicon (the second conductor 72a) in the second contact hole 67a. In addition, inasmuch as the second interlayer insulating film 64b has the upper surface A on which a wiring structure is formed in the manner similar to that of the upper surface of the interlayer insulating layer 64 illustrated in FIG. 4, the wiring structure in FIG. 8 has an advantage which is similar to that of the wiring structure in FIG. 4.

In FIGS. 7 and 8, similar parts are designated by like reference numerals. Repeated description is omitted for the purpose of simplification of the description.

In the first through the fourth embodiments of the present invention, the first and the second lower wiring section 62 (62a, 62b) and 63 (63a) on the base insulating film 61 (the first interlayer insulating film 64a) serve as the first and the second conductive sections. The first and the second conductive sections may be surface regions of a semiconductor substrate including an impurity area.

Referring to FIGS. 9(A) through 9(H), description will be made as regards a method of manufacturing a semiconductor device according to a fifth embodiment of the present invention. The illustrated semiconductor device is a stacked capacitor type DRAM cell which includes a switching transistor and a capacitor section having a storage lower electrode.

Figure 9A:
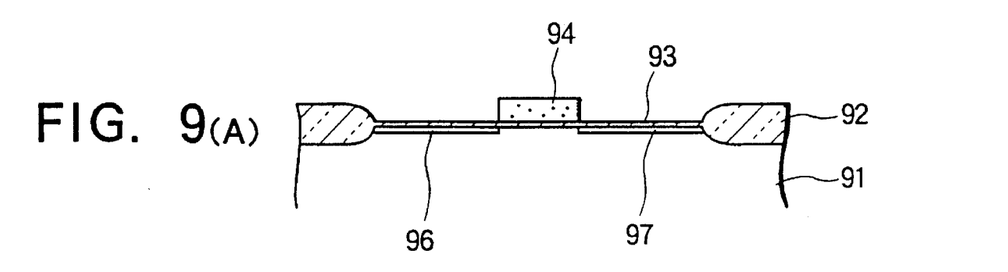
FIGS. 9(A)–9(H) illustrate the manufacturing process seqnence of a fifth embodiment of the present invention.

As shown in FIG. 9(A), a P-type silicon substrate 91 is prepared in a known manner and has the principal surface which is directed an upward of FIG. 9(A). The substrate 91 acts as a base film. A thick field oxide film 92 is formed on the principal surface of the P-type silicon substrate 91 by means of the selective oxidation process which is well known in the art. The thick field oxide film 92 defines an element forming region. On the element forming region, a thin silicon oxide film 93 is formed. The thin silicon oxide film 93 serves as a gate insulating film. On the thin silicon oxide film (the gate insulating film) 93, a gate electrode 94 is formed. The gate electrode 94 consists of polysilicon which has a thickness of 300 nm. Thereafter, by ion implantation using the gate electrode 94 as a mask, an N-type impurity such as arsenic (As) is doped in the P-type silicon substrate 91 at an acceleration voltage of 50 keV and a dose density of $5.0 \times 10^{15}$ cm$^{-2}$ Subsequently, by activating heat treatment, first and second impurity regions 96 and 97 are formed beneath the thin silicon oxide layer 93 with a channel region under the gate electrode 94 inserted between the first and the second impurity regions 96 and 97. The first and the second impurity regions 96 and 97 act as source/drain regions and are called the first and the second conductive sections, respectively. Therefore, the switching transistor comprising the gate electrode 94 and the source/drain regions 96 and 97 is obtained.

Figure 9B:
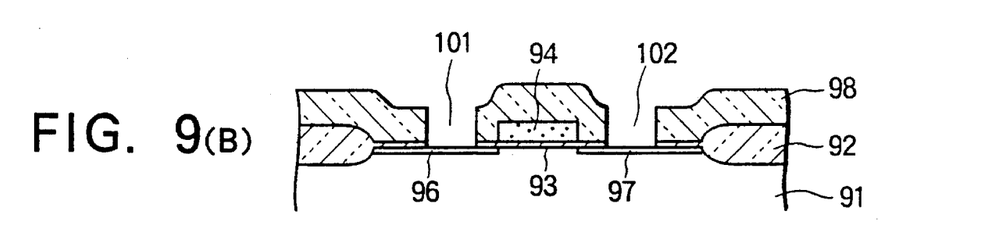

Turning to FIG. 9(B), a silicon oxide layer 98 is deposited on the thin silicon oxide layer 93, on the thick field oxide film 92, and the gate electrode 94 by the CVD process. The silicon oxide layer 98 serves as an interlayer insulating layer. The silicon oxide layer 98 has a thickness of 500 nm. In the silicon oxide layer 98, first and second contact holes 101 and 102 are simultaneously bored. The first and the second contact holes 101 and 102 reach the first and the second impurity regions 96 and 97, respectively.

Figure 9C:
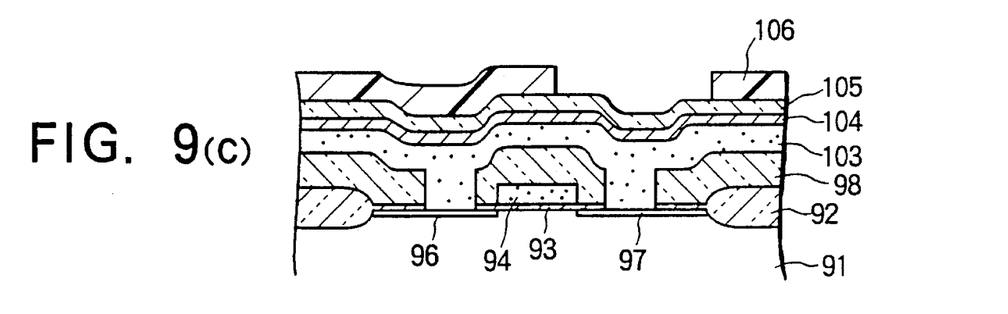

Turning to FIG. 9(C), polysilicon 103 containing an N-type impurity is deposited in the first and the second contact holes 101 and 102 and on the interlayer insulating layer 98. The polysilicon 103 has a thickness of 400 nm. On the polysilicon 103, a tungsten silicide (WSi) film 104 is formed. The tungsten silicide film 104 has a thickness of 150 nm. On the tungsten silicide film 104, an insulating film 105 is formed. The insulating film 105 may consist of a silicon oxide film which has a thickness of 200 nm. On the insulating film 105, a photoresist pattern 106 is formed.

Figure 9D:
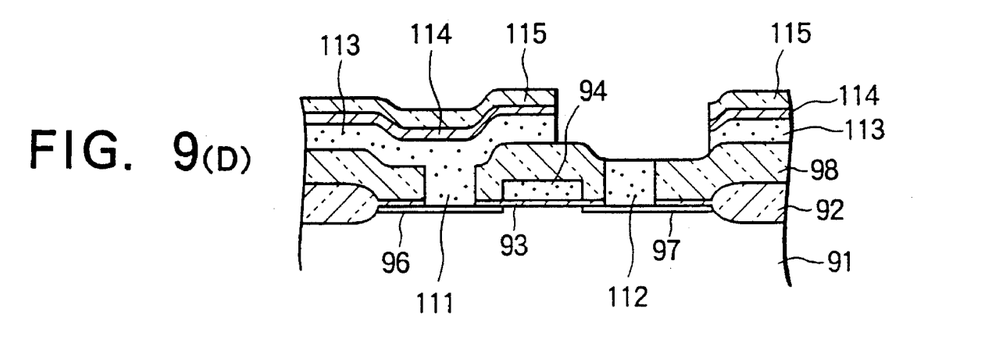

Turning to FIG. 9(D), by using the photoresist pattern 106 as a mask, the silicon oxide film 105, the tungsten silicide film 104, and the polysilicon 103 are successively etched so as to have the same plane configuration. As a result, first and second conductors 111 and 112 are embedded in the first and the second contact holes 101 and 102, respectively. A polysilicon film 113 is connected with the first conductor 111. The first and the second conductors 111 and 112 and the polysilicon film 113 are composed of the polysilicon 103 containing the N-type impurity. On the polysilicon film 113, a high melting-point metal silicide film 114 is configured from the tungsten silicide film 104. The polysilicon film 113 and the high melting-point metal silicide film 114 are collectively called a first conduction region. On the high melting-point metal silicide film 114, an upper insulating film 115 is formed out of the silicon oxide film 105. The polysilicon film 113 and the high melting-point metal silicide film 114 are collectively used as a bit line interconnected via the first conductor 111 to the first impurity region 91 which acts as either the source region or the drain region. Thereafter, the photoresist pattern 106 is removed from the upper insulating film 115.

Figure 9E:
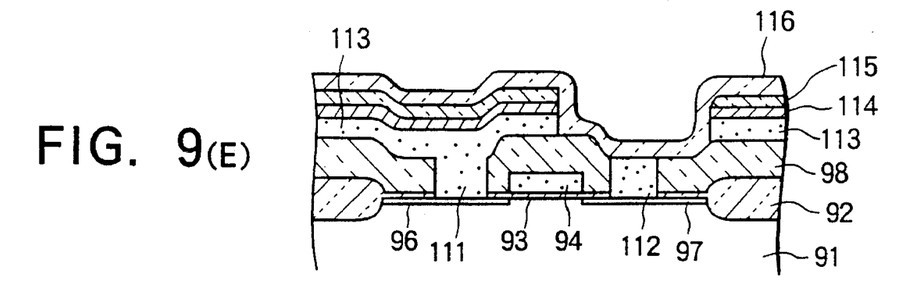

Turning to FIG. 9(E), an insulating film 116 is deposited by the CVD process on an upper surface of the upper insulating film 115, on side surfaces of the upper insulating film 115, of the high melting-point metal silicide film 114, and of the polysilicon film 113, and on upper surfaces of the interlayer insulating layer 98 and of the second conductor 112.

Figure 9F:
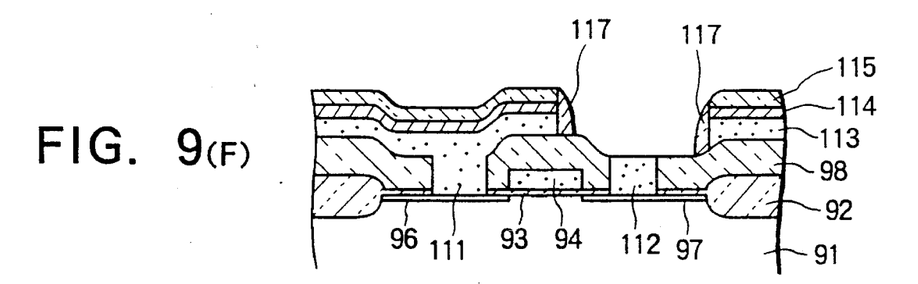

Turning to FIG. 9(F), through the use of the anisotropic dry etching process, the insulating film 116 is etched to form a side-wall insulating film 117 on the side surface of the bit line (the first conductive region). Therefore, the second conductor (the polysilicon) 112, which is embedded in the second contact hole 102, has an exposed upper surface. In this event, by little overetching, the polysilicon 112 may have a projected configuration by withdrawing the silicon oxide film 98 therearound therefrom. However, there is no problem for connection of the storage lower electrode in the following process.

Figure 9G:
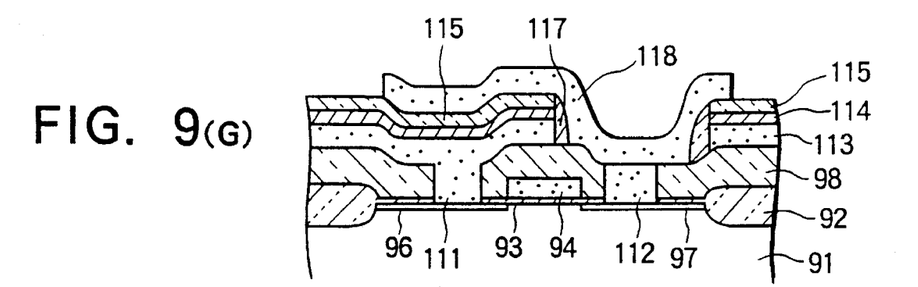

Turning to FIG. 9(G), polysilicon containing an N-type impurity is deposited on the upper surface of the upper insulating film 115, on the side-wall insulating film 117, and on the upper surfaces of the interlayer insulating layer 98 and of the second conductor 112 and is patterned to the storage lower electrode depicted at 118 which acts as a second conductive region. The storage lower electrode 118 is connected to the polysilicon (the second conductor) 112 and has a thickness of 500 nm. The storage lower electrode 118 covers the upper insulating film 115 on the bit line and the side-wall insulation film 117, thereby overlying the bit line with the storage lower electrode 118 isolated from the bit line by the upper insulating film 115 and the side-wall insulating film 117.

Figure 9H:
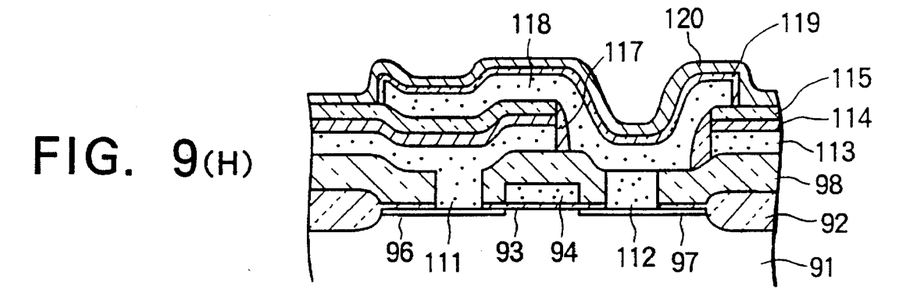

Turning to FIG. 9(H), by thermal oxidation for a surface of the storage lower electrode 118, a silicon oxide 119 is formed thereon. The silicon oxide 119 has a thickness of 8 nm and serves as a capacitor dielectric film. On the capacitor dielectric film 119 and on the upper insulating film 115, polysilicon 120 containing an impurity is formed. The polysilicon 120 acts as a storage upper electrode. A combination of the storage lower electrode 118, the capacitor dielectric film 119, and the storage upper electrode 120 composes the capacitor section. Therefore, it results in the stacked capacitor type DRAM cell.

While this invention has thus far been described in conjunction with a few embodiments thereof, it will now be readily possible for those skilled in the art to put this invention into practice in various other manners.

What is claimed is:

1. A semiconductor device comprising:

a base film having a principal surface;

an interlayer insulating region, formed on the principal surface of said base film, in which first and second conductive sections are formed, said interlayer insulating region having first and second contact holes which reach the first and the second conductive sections, respectively, said interlayer insulating region having an upper surface;

a first conductor, embedded in the first contact hole, for connecting with said first conductive section;

a first conductive region, connected with said first conductor, covering the upper surface of said interlayer insulating region, said first conductive region having an upper surface and a side surface;

an insulating film covering only the upper surface and the side-wall surface of said first conductive region, but not extending beyond the side-wall surface of said first conductive region onto the upper surface of said interlayer insulating region;

a second conductor, embedded in the second contact hole, for connecting with said second conductive section; and a second conductive region covering said second conductor, the upper surface of said interlayer insulating region, and said insulating film, said second conductive region in direct contact with the upper surface of said interlayer insulating region, whereby said second conductive region overlies said first conductive region with said second conductive region isolated from said first conductive region by said insulating film.

2. A semiconductor device as claimed in claim 1, wherein each of said first conductive region, and said first and said second conductors consists essentially of polysilicon.

3. A semiconductor device as claimed in claim 1 wherein said first conductive region comprises a polysilicon film which consists essentially of polysilicon, said polysilicon film having an upper surface, and a high melting-point metal silicide film formed on the upper surface of said polysilicon film.

4. A semiconductor device as claimed in claim 3, wherein said high melting-point metal silicide film consists of a tungsten silicide film.

5. A semiconductor device as claimed in claim 1, wherein said first and said second conductive sections compose an n-th wiring layer formed on said base insulating film where n represents a natural number, said first conductive region composing an (n+1)-th wiring layer, and said second conductive region composing an (n+2)-th wiring layer.

6. A semiconductor device as claimed in claim 1, wherein said interlayer insulating region comprises a first interlayer insulating film formed on the principal surface of said base film and a second interlayer insulating film formed on the first interlayer insulating film, said first conductive section being formed on the principal surface of the base film, said second conductive section being formed on the first interlayer insulating film, the first contact hole being bored in both the first interlayer insulating film and the second interlayer insulating film, the second contact hole being bored in the second interlayer insulating film alone.

7. A semiconductor device as claimed in claim 1, wherein said interlayer insulating region comprises a first interlayer insulating film formed on the principal surface of said base film and a second interlayer insulating film formed on the first interlayer insulating film, said first conductive section being formed on the first interlayer insulating film, said second conductive section being formed on the principal surface of said base film, the first contact hole being bored in the second interlayer insulating film alone, the second contact hole being bored in both the first interlayer insulating film and the second interlayer insulating film.

8. A semiconductor device as claimed in claim 1, wherein said base film is a semiconductor substrate, the first and the second conductive sections being first and second impurity regions formed on the semiconductor substrate, respectively.

9. A semiconductor device as claimed in claim 8, wherein the first impurity region is one of source/drain regions, the second impurity region being another of the source/drain regions, said first conductive region being composed of a bit line which connects with the first impurity region through said first conductor, said second conductive region being composed of a storage lower electrode which connects with the second impurity region through said second conductor.

10. A semiconductor device comprising:

a base insulating film having a principal surface;

first and second lower wiring sections formed on the principal surface of said base insulating film;

an interlayer insulating region, formed on the principal surface of said base insulating film, covering said first and second lower wiring sections, said interlayer insulating region having first and second contact holes which reach said first and said second lower wiring sections, respectively, said interlayer insulating region having an upper surface;

a first conductor, embedded in the first contact hole, for connecting with said first lower wiring section;

a first upper wiring section, connected with said first conductor, covering the upper surface of said interlayer insulating region, said first upper wiring section having an upper surface and a side surface;

an insulating film covering only the upper surface and the side-wall surface of said first upper wiring section, but not extending beyond the side-wall surface of said first upper wiring section onto the upper surface of said interlayer insulating region;

a second conductor, embedded in the second contact hole, for connecting with said second lower wiring section; and a second upper wiring section covering said second conductor, the upper surface of said interlayer insulating region, and said insulating film, said second upper wiring section in direct contact with the upper surface of said interlayer insulating region, whereby said second upper wiring section overlies said first upper wiring section with said second upper wiring section isolated from said first upper wiring section by said insulating film.

11. A semiconductor device as claimed in claim 10, wherein each of said first upper wiring section, and said first and said second conductors consists essentially of polysilicon.

12. A semiconductor device as claimed in claim 10, wherein said first upper wiring section comprises a polysilicon film which consists essentially of polysilicon, said polysilicon film having an upper surface, and a high melting-point metal silicide film formed on the upper surface of said polysilicon film.

13. A semiconductor device as claimed in claim 12, wherein said high melting-point metal silicide film consists of a tungsten silicide film.

14. A semiconductor device comprising:

a base insulating film having a principal surface;

first lower wiring sections formed on the principal surface of said base insulating film;

an first interlayer insulating film which is formed on the principal surface of said base insulating film and which covers said first lower wiring section;

second lower wiring sections formed on said first interlayer insulating film;

a second interlayer insulating film which is formed on said first interlayer insulating film and which covers said second lower wiring section, both said first interlayer insulating film and said second interlayer insulating films having a first contact hole which reaches said first lower wiring section, only said second interlayer insulating film having a second contact hole which reaches said second lower wiring section, said second interlayer insulating region having an upper surface;

a first conductor, embedded in the first contact hole, for connecting with said first lower wiring section;

a first upper wiring section, connected with said first conductor, covering the upper surface of said second interlayer insulating region, said first upper wiring section having an upper surface and a side surface;

a third insulating film covering only the upper surface and the side-wall surface of said first upper wiring section, but not extending beyond the side-wall surface of said first upper wiring section onto the upper surface of said second interlayer insulating film;

a second conductor, embedded in the second contact hole, for connecting with said second lower wiring section; and a second upper wiring section covering said second conductor, the upper surface of said second interlayer insulating region, and said third insulating film, said second upper wiring section in direct contact with the upper surface of said second interlayer insulating film, whereby said second upper wiring section overlies said first upper wiring section with said second upper wiring section isolated from said first upper wiring section by said third insulating film.

15. A semiconductor device as claimed in claim 14, wherein said first upper wiring section comprises a polysilicon film which consists essentially of polysilicon, said polysilicon film having an upper surface, and a high melting-point metal silicide film formed on the upper surface of said polysilicon film.

16. A semiconductor device as claimed in claim 15, wherein said high melting-point metal silicide film consists of a tungsten silicide film.

17. A semiconductor device comprising:

a base insulating film having a principal surface;

first lower wiring sections formed on the principal surface of said base insulating film;

an first interlayer insulating film which is formed on the principal surface of said base insulating film and which covers said first lower wiring section;

second lower wiring sections formed on said first interlayer insulating film;

a second interlayer insulating film which is formed on said first interlayer insulating film and which covers said second lower wiring section, only said second interlayer insulating film having a first contact hole which reaches said second lower wiring section, both said first interlayer insulating film and said second interlayer insulating films having a second contact hole which reaches said first lower wiring section, said second interlayer insulating region having an upper surface;

a first conductor, embedded in the first contact hole, for connecting with said second lower wiring section;

a first upper wiring section, connected with said first conductor, covering the upper surface of said second interlayer insulating region, said first upper wiring section having an upper surface and a side surface;

a third insulating film covering only the upper surface and the side-wall surface of said first upper wiring section but not extending beyond the side-wall surface of said first upper wiring section onto the upper surface of said second interlayer insulating film;

a second conductor, embedded in the second contact hole, for connecting with said first lower wiring section; and a second upper wiring section covering said second conductor, the upper surface of said second interlayer insulating region, and said third insulating film, said second upper wiring section in direct contact with the upper surface of said second interlayer insulating film, whereby said second upper wiring section overlies said first upper wiring section with said second upper wiring section isolated from said first upper wiring section by said third insulating film.

18. A semiconductor device as claimed in claim 17, wherein said first upper wiring section comprises a polysilicon film which consists essentially of polysilicon, said polysilicon film having an upper surface, and a high melting-point metal silicide film formed on the upper surface of said polysilicon film.

19. A semiconductor device as claimed in claim 18, wherein said high melting-point metal silicide film consists of a tungsten silicide film.

20. In a semiconductor memory device comprising a plurality of memory cells each of which includes a switching transistor and a capacitor section having a storage lower electrode, each of said memory cells comprising:

a semiconductor substrate having a principal surface;

a thick field oxide film which is formed on the principal surface of said semiconductor substrate and which defines an element forming region;

a gate insulating film formed on the element forming region;

a gate electrode selectively coating said gate insulating film;

first and second impurity regions formed under the principal surface of said semiconductor substrate in the element forming region except for said gate electrode, said first and said second impurity regions serving as source/drain regions, thereby forming said switching transistor which comprises said gate electrode and said source/drain regions;

an interlayer insulating region covering said switching transistor, said interlayer insulating region having first and second contact holes which reach the first and the second conductive sections, respectively, said interlayer insulating region having an upper surface;

a first conductor, embedded in the first contact hole, for connecting with said first impurity region;

a first conductive region, connected with said first conductor, covering the upper surface of said interlayer insulating region, said first conductive region being composed of a bit line, said first conductive region having an upper surface and a side surface;

an inter-region insulating film covering only the upper surface and the side-wall surface of said first conductive region, but not extending beyond the side-wall surface of said first conductive region onto the upper surface of said interlayer insulating region;

a second conductor, embedded in the second contact hole, for connecting with said second impurity region; and a second conductive region covering said second conductor, the upper surface of said interlayer insulating region, and said inter-region insulating film, said second conductive region overlying said first conductive region and in direct contact with the upper surface of said interlayer insulating region with said second conductive region isolated from said first conductive region by said inter-region insulating film, whereby said second conductive region serves as said storage lower electrode.

21. A semiconductor memory device as claimed in claim 20, wherein each of said first and said second conductors consists essentially of polysilicon.

22. A semiconductor memory device as claimed in claim 20, wherein said first conductive region comprises a polysilicon film which consists essentially of polysilicon, said polysilicon film having an upper surface, and a high melting-point metal silicide film formed on the upper surface of said polysilicon film.

23. A semiconductor memory device as claimed in claim 20, wherein each of said memory cells further comprises a capacitor dielectric film coating said storage lower electrode and a storage upper electrode covering said capacitor dielectric film, thereby resulting in said capacitor section.

24. A semiconductor memory device as claimed in claim 22, wherein said high melting-point metal silicide film consists of a tungsten silicide film.

* * * * *